United States Patent
Soderstrom et al.

(10) Patent No.: US 8,704,084 B2
(45) Date of Patent: *Apr. 22, 2014

(54) MULTIPLE-JUNCTION PHOTOELECTRIC DEVICE AND ITS PRODUCTION PROCESS

(75) Inventors: Thomas Soderstrom, St-Sulpice (CH); Franz-Joseph Haug, Saint-Blaise (CH); Xavier Niquille, Neuchatel (CH)

(73) Assignee: Universite de Neuchatel, Neuchatel (CH)

( * ) Notice: Subject to any disclaimer, the term of this patent is extended or adjusted under 35 U.S.C. 154(b) by 340 days.

This patent is subject to a terminal disclaimer.

(21) Appl. No.: 13/130,228

(22) PCT Filed: Nov. 18, 2009

(86) PCT No.: PCT/EP2009/065357
§ 371 (c)(1),
(2), (4) Date: Jun. 10, 2011

(87) PCT Pub. No.: WO2010/057901
PCT Pub. Date: May 27, 2010

(65) Prior Publication Data
US 2011/0226319 A1 Sep. 22, 2011

(30) Foreign Application Priority Data
Nov. 19, 2008 (EP) .................................. 08169423

(51) Int. Cl.
*H01L 31/00* (2006.01)
(52) U.S. Cl.
USPC ........................................................ 136/255
(58) Field of Classification Search
USPC ........................................................ 136/255
See application file for complete search history.

(56) References Cited

U.S. PATENT DOCUMENTS

| | | | |
|---|---|---|---|
| 6,825,408 B2 | 11/2004 | Nagano et al. | |
| 2002/0011263 A1 | 1/2002 | Muramoto et al. | |
| 2002/0050289 A1* | 5/2002 | Wada et al. | 136/256 |
| 2002/0134425 A1 | 9/2002 | Yamamoto et al. | |
| 2005/0145972 A1* | 7/2005 | Fukuda et al. | 257/458 |

OTHER PUBLICATIONS

Sannomiya H. Ed—Japan Society of Applied Physics: "A-SIC/A-SI/A-SIGE Multi-Bandgap Stacked Solar Cells With Bandgap Profiling", Proceedings of the International Photovoltaic Science and Engineering Conference. Kyoto, Nov. 26-30, 1990, [Proceedings of the International Photovoltaic Science and Engineering Conference], Kyoto, Kyoto University, JP, vol. CONF. 5, Nov. 26, 1990, pp. 387-390, XP000215068.

(Continued)

*Primary Examiner* — Jeffrey T Barton
*Assistant Examiner* — Uyen Tran
(74) *Attorney, Agent, or Firm* — Young & Thompson

(57) ABSTRACT

A multiple-junction photoelectric device includes a substrate on which a first conducting layer is deposited, at least two elementary photoelectric devices of n-i-p or n-p configuration, on which a second conducting layer is deposited, and at least one intermediate layer between two adjacent elementary photoelectric devices. The intermediate layer has, on the incoming light side, top and bottom faces, the latter having a peak-valley roughness >150 nm, the top and bottom faces having respectively a surface morphology including inclined elementary surfaces so $\alpha_{90bottom} < \alpha_{90top}$ by at least 3; where $\alpha_{90top}$ is the angle for which 90% of the elementary surfaces of the top face of the intermediate layer have an inclination ≤this angle, and $\alpha_{90bottom}$ is the angle for which 90% of the elementary surfaces of the surface of the bottom face of the intermediate layer have an inclination ≤this angle.

27 Claims, 3 Drawing Sheets

(56) References Cited

OTHER PUBLICATIONS

M. Worgull et al.: "Modeling and optimization of the hot embossing process for micro- and nanocomponent fabrication" Accepted: Oct. 28, 2005 / Published online: Mar. 31, 2006, Microsyst Technol (2006) 12: 947-952.

J. Steinhauser et al.: "Effect of Rough ZnO Layers in Improving Performances of Microcrystalline Silicon Solar Cells", 20th European Photovoltaic Solar Energy Conference, Jun. 6-10, 2005, Barcelona, Spain, Academy of Science, Prague, Czech Republic.

Martin Python et al.: "Relation between substrate surface morphology and microcrystalline silicon solar cell Performance", Institute of Microtechnology IMT, Thin film silicon and photovoltaics Laboratory, Neuchatel, Switzerland, Journal of Non-Crystalline Solids 354 (2008) 2258-2262.

Hitoshi Sai et al.: "Effect of self-orderly textured back reflectors on light trapping in thin-film microcrystalline silicon solar cells", Journal of Applied Physics 105, 094511 (2009), Research Center for Photovoltaics, National Institute of Advanced Industrial Science and Technology, accepted Feb. 24, 2009; published online May 14, 2009.

Thomas Soderstrom et al.: "Optical developments for silicon thin film solar cells in the substrate configuration", Mater. Res. Soc. Symp. Proc. vol. 1101 2008 Materials Research Society, IMT/UNINE, Rue A.-L. Breguet 2, Neuchatel, 2000, Switzerland.

T. Soderstrom et al.: "Optimization of amorphous silicon thin film solar cells for flexible photovoltaics", Institute of Microtechnology, University of Neuchatel, Rue A.-L. Breguet 2, CH-2000 Neuchatel, Switzerland, Journal of Applied Physics 103, 114509 (2008), accepted Apr. 9, 2008; published online Jun. 11, 2008.

U. Kroll et al.: "Potential of VHF-plasmas for low-cost production of a-Si H solar cells", Institut de Microtechnique, Universitb de Neuchatel, A.-L. Breguet 2, CH-2000 Neuchgttel, Switzerland, Solar Energy Materials and Solar Cells 48 (1997) 343 350.

R. H. Franken et al.: "Understanding light trapping by light scattering textured back electrodes in thin film n-i-p-type silicon solar cells", Physics of Devices, SID, Faculty of Sciences, Utrecht University, P.O. Box 80.000, 3508 TA Utrecht, The Netherlands, Journal of Applied Physics 102, 014503 (2007), accepted May 16, 2007; published online Jul. 5, 2007.

C. Elsner et al.: "3 D-microstructure replication processes using UV-curable acrylates", Institut fur Oberflachenmodifizierung, Permoserstrasse 15, D-04318 Leipzig, Germany, Microelectronic Engineering 65 (2003) 163-170.

A. Banerjeea et al.: "Study of back reflectors for amorphous silicon alloy solar cell application", Energy Conversion Devices, Inc., 1675 West Maple Road, Troy, Michigan 48084, accepted for publication Sep. 26, 1990.

J. Bailat et al. "Recent Development of Solar Cells on Low-Cost Plastic, Substrates", 20th European Photovoltaic Solar Energy Conference, Jun. 6-10, 2005, Barcelona, Spain.

European Search Report, dated Apr. 28, 2009, from corresponding European application.

International Search Report, dated May 19, 2010, from corresponding PCT application.

* cited by examiner

MULTIPLE-JUNCTION PHOTOELECTRIC DEVICE AND ITS PRODUCTION PROCESS

TECHNICAL FIELD

The present invention relates to the field of photoelectric devices. More particularly, it relates to a photoelectric device composed of elementary cells of n-i-p or n-p configuration, which are stacked on top of one another and absorb the light over different wavelength ranges. Such devices are called multiple-junction cells. The invention also relates to a process for producing this photoelectric device.

A particularly advantageous application of the present invention is for the production of photovoltaic cells intended for generating electrical energy, but the invention also applies, more generally, to any structure in which light radiation is converted into an electrical signal, such as photodetectors.

PRIOR ART

Conventionally, a silicon thin-film double-junction or tandem cell consists of a top cell made of amorphous silicon, which absorbs visible light (up to about 750 nm), and a bottom cell made of microcrystalline silicon, which absorbs light up to the infrared (up to about 1100 nm). Such a tandem cell is called a "micromorph" cell. In the present description, "top" denotes the side close to the incident light while "bottom" denotes the side away from the incident light.

To increase the current, both in a single junction cell and in a multiple-junction cell, the rear contact is rough so as to scatter the light in the device. The layers are deposited on top of another and then the substrate roughness propagates through the interfaces of the layers. Usually, thin layers (0-500 nm) keep the original surface roughness of the substrates, whereas thick layers (>1 µm) flattens the original roughness. A rough surface consists of a succession of bumps and hollows formed from elementary surfaces of greater or lesser inclination, which may include sharp edges (at the top of the bumps or at the bottom of the hollows). The morphology of the surface of the substrate plays a paramount role in the optical performance (short-circuit current density ($J_{sc}$)) and electrical performance (open-circuit voltage ($V_{oc}$) and fill factor (FF)), i.e. the efficiency of the solar cell.

As regards microcrystalline cells, such a cell has better electrical characteristics (better fill factor (FF) and better open-circuit voltage (Voc)) if it is deposited on a substrate having no or few highly inclined elementary surfaces. However, highly inclined elementary surfaces of the interfaces promote the scattering of the light in the cell. Thus, the optical characteristics of the cell (short-circuit current ($J_{sc}$)) are improved. The best compromise is soft morphology of the substrate (rounded valley see M. Python et al., Journal of Non-Crystalline Solids, 354, 19-25, 2008) with large feature size (H. Sai and M. Kondo, Journal of Applied Physics, 105, 094511, 2009).

As regards an amorphous cell, the electrical characteristics of the amorphous cell suffer little, if at all, from the acute substrate morphology. However, it suffers from degradation in the efficiency when it is exposed to light. The means of limiting the degradation is to reduce the thickness of the cell. To reduce the thickness of the cell and maintain good efficiencies, substrates with highly inclined elementary surfaces and reduced featured size (see T. Soderstrom et al., Journal of Applied Physics, 103, 114509, 2008) are used to increase the light scattering in the cell.

In a tandem or multi-junction cell, the problem consists in increasing the current density or absorption of light in both cells using rough surfaces that scatter the light in the absorbers. However, the optimum morphologies for the "top" and "bottom" cells are different as discussed above. Specifically, the "top" cell requires an acute morphology, that means with highly inclined elementary surfaces, so as to increase its current density, to reduce its thickness and thus limit its degradation. However, with this type of morphology, the "bottom" microcrystalline cell suffers from an unsuitable morphology, which is manifested in the tandem cell by the same symptoms as in a single cell, namely a drop in the fill factor FF and in the open-circuit voltage $V_{oc}$.

To alleviate this problem, it has been proposed to place a thin intermediate mirror (50-150 nm in thickness) between the "top" cell and the "bottom" cell, enabling the "top" cell current to be increased. An intermediate mirror is a layer placed between two elementary cells with a refractive index (n) smaller than the refractive indices of the elementary cells. For a "micromorph" cell, such an intermediate mirror with a refractive index (n) of typically between 1.3 and 2.5 is inserted between the "top" cell and the "bottom" cell. This makes it possible to increase the current density of the "top" cell without having to increase its thickness, thereby minimizing the effect of the light induced degradation of the "top" cell under illumination.

However, since the surface morphologies are greatly influenced by the deposition of the previous layer, such a mirror reproduces the morphology of the "bottom" cell and does not make it possible to create two different morphologies, one adapted to the "top" cell and the other to the "bottom" cell.

U.S. Pat. No. 6,825,408 describes the use, between the "top" cell and the "bottom" cell, of an intermediate layer having irregular surfaces of different heights (Ry or Rmax), the surface on the "bottom" side having an average height difference greater than that of the surface on the "top" side.

However, these height criteria do not make it possible to obtain the optimum surface morphologies for the two cells either. Specifically, this admittedly allows the percentage of light entering the device to be increased, but the increase in efficiency is still insufficient.

The patent application US 2002/0011263 describes the use, between the "top" cell and the "bottom" cell, of an intermediate layer having irregular surfaces of different heights, the surface on the "top" side having an average height difference greater than that of the surface on the "bottom" side. In this application, the surface level difference (Ry) of the photoelectric conversion device lying below the intermediate layer (i.e. the first electrode layer) is in the range of 5 to 150 nm. Therefore, the bottom face of the intermediate layer has also a surface level difference (Ry) comprised between 5 nm and 150 nm. FIG. 7 of US 2002/0011263 shows that the surface level difference of the first electrode should be less than 150 nm. As known by a skilled man in the art, with Ry greater than 150 nm, electrical properties of the crystalline silicon photoelectric conversion device decrease rapidly.

However, these height criteria do not make it possible to obtain the optimum surface morphologies for the two cells either.

An object of the present invention is therefore to alleviate these drawbacks, by providing a higher-performance photoelectric device having separately optimized surface morphologies for the growth of each of the two elementary cells.

DISCLOSURE OF THE INVENTION

For this purpose, and in accordance with the present invention, what is proposed is a multiple-junction photoelectric device comprising a substrate on which a first conducting layer is deposited, at least two elementary photoelectric devices of n-i-p or n-p configuration, on which a second conducting layer is deposited, and at least one intermediate layer provided between two adjacent elementary photoelectric devices, said intermediate layer having, on the incoming light side, an top face and, on the other side, a bottom face, said bottom face having a peak to valley roughness greater than 150 nm, and said top and bottom faces having respectively a surface morphology comprising inclined elementary surfaces such that $\alpha_{90bottom}$ is smaller than $\alpha_{90top}$ by at least 3°, preferably 6°, more preferably 10°, and even more preferably 15°; where $\alpha_{90top}$ is the angle for which 90% of the elementary surfaces of the top face of the intermediate layer have an inclination equal to or less than this angle, and $\alpha_{90bottom}$ is the angle for which 90% of the elementary surfaces of the bottom face of the intermediate layer have an inclination equal to or less than this angle.

Such surface morphologies make it possible for the morphologies theoretically required by each of the faces of the intermediate layer to be optimally reconciled and thus make it possible for a higher-performance device to be obtained.

In fact, the morphology of the surfaces is drastically modified without any modification of the average height difference.

On the contrary, the document of the prior art US 2002/0011263 teaches to have a peak to valley roughness in the uneven surface of the intermediate layer greater than that of the photoelectric device lying below such intermediate layer, which is less than 150 nm, but US 2002/0011263 gives no indication about the angular morphology of the elementary surfaces of the faces of the intermediate layer. From a geometric point of view, the peak to valley roughness could be modified while keeping the same angles of the elementary surfaces.

But, by controlling the morphology of the faces of the intermediate layer, the present invention allows to have an intermediate layer having a bottom face with a peak to valley roughness greater than 150 nm, in such a way as to promote the scattering of the light in the cell and to improve the optical characteristics of the cell, without any drastic decrease of the electrical characteristics of the cell.

The present invention also relates to a process for producing a multiple-junction photoelectric device comprising a substrate on which a first conducting layer is deposited, at least two elementary photoelectric devices of n-i-p or n-p configuration on which a second conducting layer is deposited. According to the invention, the process includes a step of depositing, on at least one of said elementary photoelectric devices, an intermediate layer having, on the incoming light side, an top face and, on the other side, a bottom face, said bottom face having a peak to valley roughness greater than 150 nm, and said top and bottom faces having respectively a surface morphology comprising inclined elementary surfaces such that $\alpha_{90bottom}$ is smaller than $\alpha_{90top}$ by at least 3°, preferably 6°, more preferably 10°, and even more preferably 15°; where $\alpha_{90top}$ and $\alpha_{90bottom}$ are defined above.

Preferably, the step of depositing the intermediate layer is carried out in only one step.

BRIEF DESCRIPTION OF THE DRAWINGS

Other features of the present invention will become more clearly apparent on reading the following description, given with reference to the appended drawings in which.

EMBODIMENTS OF THE INVENTION

Figure 1:
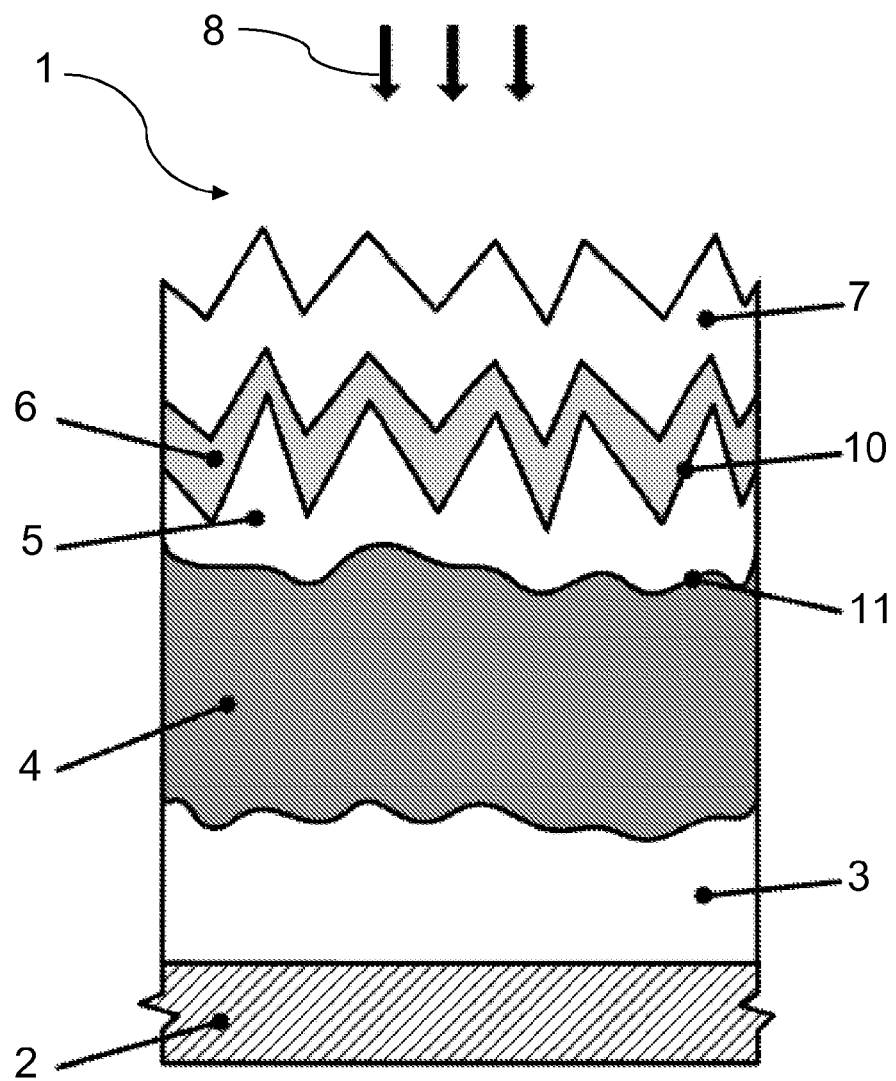
FIG. 1 shows a diagram of a tandem cell according to the invention.

FIG. 1 shows a photoelectric device or a "micromorph" cell 1 comprising, stacked on top of one another, a substrate 2, a first conducting layer 3, constituting a first electrode, a first elementary photoelectric device 4, called the bottom or "bottom" cell, an intermediate layer 5, a second elementary photoelectric device 6, called the top or "top" cell, and a transparent second conducting layer 7, constituting a second electrode. The device 1 is exposed to light oriented along the arrows 8.

The intermediate layer 5 has, on the incoming light side, a top face 10 and, on the other side, a bottom face 11.

According to the invention, said bottom face 11 has a peak to valley roughness greater than 150 nm, and said top 10 and bottom 11 faces have respectively a surface morphology comprising inclined elementary surfaces such that $\alpha_{90bottom}$ is smaller than $\alpha_{90top}$ by at least 3°, preferably 6°, more preferably 10°, and even more preferably 15°; where $\alpha_{90top}$ is the angle for which 90% of the elementary surfaces of the top face 10 of the intermediate layer 5 have an inclination equal to or less than this angle, and $\alpha_{90lower}$ is the angle for which 90% of the elementary surfaces of the bottom face 11 of the intermediate layer 5 have an inclination equal to or less than this angle.

For example, the difference $(\alpha_{90top}-\alpha_{90bottom})$ may be comprised between 5° and 25°, preferably between 8° and 15°, and more preferably between 8° and 14°.

Figure 2:
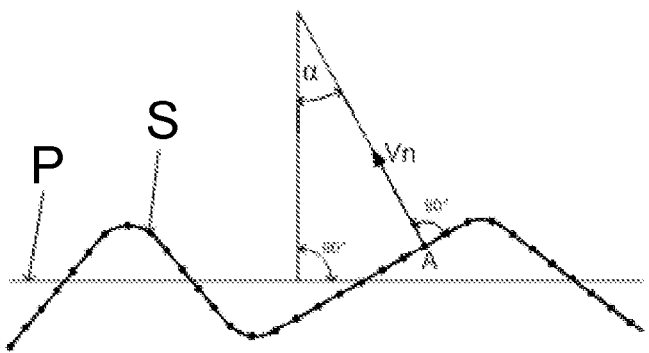
FIG. 2 shows a diagram illustrating the calculation of the angle of inclination of the surface at the point A of an atomic force microscopy (AFM) image.

Referring to FIG. 2, the morphology of the surface is described here by the inclinations of the elementary surfaces making up the rough surface of the specimen, also called the angular distribution of the surface. To do this, an AFM measurement is carried out on a surface measuring 5 μm×5 μm corresponding to a matrix of 256×256 equidistant points (x and y axes in the conventional coordinate system) which represents the topology (z axis) of the surface of the specimen. To remove any inclination or curvature of the substrate, the 2nd-order polynomial that minimizes the sum of the squared differences between itself and the surface is subtracted from this image. What is thus obtained is a good representation of the morphology of the surface S, which typically consists of structures having sizes between 50 and 2000 nm. The plane z=0 is defined as being the horizontal plane P.

To obtain the angular distribution of the surfaces, the angle between the vector normal to the horizontal plane P and the vector Vn normal to the surface S is calculated for each point A in the AFM image. To do this, the relevant elementary surface for calculating the normal to the point A is defined by the point A and two vectors Vx and Vy. Vx is the vector that connects the two points (close neighbours in the AFM matrix) before and after the point A in the direction x and Vy is the vector that connects the two points (close neighbours in the AFM matrix) before and after the point A in the direction y. The vector Vn normal to the elementary surface in question is determined by the vector product of Vx and Vy. The angle of inclination α of the elementary surface is defined as the angle between the normal vector Vn of the elementary surface in question and the vector normal to the horizontal plane P.

A new matrix of points representing the inclination of each elementary surface at each point in the AFM matrix may be constructed. Starting from the matrix that indicates the inclination at each point of the surface, it is possible to produce a histogram of the angles from 0 to 90° (angular distribution) that gives the proportion of the surface which has an inclination lying within a certain angle interval (typically 2 degrees). By integrating the latter from 0 to α, the integral of the angular distribution is obtained (cf. FIG. 3). The angles are plotted on the x-axis. The proportion of elementary surfaces having an inclination to the horizontal plane equal to or less than a given angle is plotted on the y-axis. A flat horizontal surface is defined as one where all the elementary surfaces have an inclination an angle of equal to 0°, and therefore the integral of the angular distribution is equal to 1 between 0° and 90°. In contrast, an extremely rough surface, with highly inclined elementary surfaces, shows an angular distribution with a high proportion of surface elementary surfaces having high angles of inclination and an integral of the angular distribution close to 0 for small angles (e.g.: 0°-15°) and close to 1 only for large angles (e.g.: 30°-70°).

In the present invention, to characterize the morphology of a surface, the value a in question is the angle $\alpha_{90}$ for which 90% of the elementary surfaces of the studied surface have an inclination equal to or less than this angle.

Preferably, the angle $\alpha_{90top}$ is comprised between 20° and 80°, more preferably between 25° and 50°.

Preferably, the angle $\alpha_{90bottom}$ is comprised between 5° and 40°, more preferably between 5° and 25°.

The peak to valley roughness is defined by JIS B0601 (maximum height; may be referred to as Ry or Rmax).

The peak to valley roughness of the bottom face 11 may be comprised between 200 nm and 2 000 nm, preferably between 200 nm and 900 nm, more preferably between 300 nm and 600 nm, and still more preferably between 300 nm and 450 nm.

Preferably, the peak to valley roughness of the top face 10 is greater than the peak to valley roughness of the bottom face 11.

The peak to valley roughness of the top face 10 may be comprised between 200 nm and 2 000 nm, preferably between 200 nm and 900 nm, more preferably between 300 nm and 600 nm, and still more preferably between 300 nm and 500 nm.

The substrate 2 may be made of a material chosen from the group comprising plastics (for example PEN, PET and polyimide), glass, a metal (for example a steel), silicon or other materials resistant to the solar cell fabrication conditions (cf. J. Bailat, V. Terrazzoni-Daudrix, J. Guillet, F. Freitas, X. Niquille, A. Shah, C. Ballif, T. Scharf, R. Morf, A. Hansen, D. Fischer, Y. Ziegler and A. Closset, Proc. of the 20th European PVSEC (2005) 1529).

A texture may be applied to the substrate by UV-NIL (cf. C. Elsner, J. Dienelt and D. Hirsch, Microelectronic Engineering 65 (2003) 163) or by direct embossing (cf. M. Worgull, J. F. Hétu, K. K. Kabanemi and M. Heckele, Microsystem Technologies 12 (2006) 947) for flexible substrates.

The first conducting layer 3 is made of a transparent conducting oxide (for example ZnO or ITO) (cf. T. Söderström, F.-J. Haug, O. Cubero, X. Niquille and C. Ballif, Mater. Res. Soc. Symp. Proc. Volume 1101E, Warrendale, Pa., 2008 (2008) 1101), metal (Ag, Al), or the combination of a transparent oxide and a metal (cf. A. Banerjee and S. Guha, Journal of Applied Physics 69 (1991) 1030, or R. H. Franken, R. L. Stolk, H. Li, C. H. M. v. d. Werf, J. K. Rath and R. E. I. Schropp, Journal of Applied Physics 102 (2007) 014503).

The second conducting layer 7 is made of a transparent conducting oxide (for example ZnO, ITO, InO, $SnO_2$, etc.).

The conducting layers 3 and 7 are deposited by processes known to those skilled in the art, such as evaporation, sputtering, and chemical deposition. For the first conducting layer 3, it is preferred to use the sputtering process for the conducting layers (Ag, transparent oxide) or the chemical deposition process (examples: LP-CVD ZnO, AP-CVD $SnO_2$), making it possible to obtain a conducting layer having an optimum surface morphology for the top elementary cell 4. The morphology may also be given by a layer deposited on the substrate 2 or embossed directly on the substrate (cf. C. Elsner, J. Dienelt and D. Hirsch, Microelectronic Engineering 65 (2003) 163, or M. Worgull, J. F. Hétu, K. K. Kabanemi and M. Heckele, Microsystem Technologies 12 (2006) 947).

The elementary photoelectric devices 4 and 6 may have the n-i-p or n-p configuration. This means that the first layer deposited for producing the elementary cell is the n layer, then optionally the i layer, and then the p layer. This makes it possible to use non-transparent or flexible substrates. Of course, it is obvious that all combinations are possible. In particular when the device comprises two elementary cells, the four combinations n-i-p/n-i-p, n-p/n-i-p, n-p/n-p and n-i-p/n-p are possible. The n-i-p/n-i-p combination is preferred for the structure of the tandem cell.

Advantageously, the elementary photoelectric device 4 or "bottom cell" located on the side facing the substrate 2 relative to the intermediate layer 5, is made of a semiconductor material characterized by a bandgap $E_{gbottom}$ and the elementary photoelectric device 6 or "top cell", located on the incoming light side, is made of a semiconductor material characterized by a bandgap $E_{gtop}$. Preferably, the bandgap $E_{gtop}$ is greater than the bandgap $E_{gbottom}$ so as to complementarily absorb the solar light spectrum.

The elementary photoelectric device 4, or bottom cell, is based on silicon or is a semiconductor, for a photovoltaic application. Preferably, it is based on crystalline silicon or microcrystalline silicon or silicon-germanium or a silicon compound enabling the energy bandgap to be reduced with respect to amorphous silicon.

The elementary photoelectric device 6, or top cell, is a semiconductor, preferably based on silicon, for a photovoltaic application. Preferably, it is based on amorphous silicon or on a silicon compound having a bandgap greater than amorphous silicon (for example SiC, SiO, etc.). It has a thickness of between 50 and 400 nm, preferably between 100 nm and 250 nm.

Preferably, the elementary photoelectric device 4, or bottom cell, is based on microcrystalline silicon and the other elementary photoelectric device 6, or top cell, is based on amorphous silicon or an amorphous silicon alloy such as for example amorphous silicon carbide, nitride and oxide.

The elementary cells 4 and 6 are deposited by processes known to those skilled in the art. Preferably, a PECVD (plasma-enhanced chemical vapour deposition) process is used (cf. U. Kroll, A. Shah, H. Keppner, J. Meier, P. Torres and D. Fischer, Potential of VHF-Plasmas for Low-Cost Production of a-Si:H Solar Cells Solar Energy Materials and Solar Cells, Vol 48, pp. 343-350, 1997).

After the bottom elementary cell 4 has been deposited, an intermediate layer 5 is deposited but makes it possible to restore a suitable morphology for the top elementary cell 6.

The intermediate layer 5 consists of a layer characterized by a refractive index of less than that of silicon (n=4), typically 1.5<n<2.5. The intermediate layer 5 consists of a layer of an oxide chosen from the group comprising zinc oxide, doped silicon oxides, doped porous silicon oxides, tin oxide, indium oxide and combinations thereof. Preferably, transparent zinc oxide is used.

The intermediate layer 5 may have a thickness of between 0.1 μm and 100 μm. Preferably, the intermediate layer 5 has a thickness of between 0.6 μm and 5 μm, more preferably between 0.8 μm and 3 μm.

According to a variant of the invention, the surface morphology of the top face 10 of the intermediate layer 5, as defined above, may be obtained by the very nature of its fabrication process, that is to say by growth of the chosen oxide. To do this, during the step of depositing the intermediate layer 5, a process is used that makes it possible to obtain the required surface morphology of the top face 10 by growth of the oxide used. This process uses one of the techniques chosen from the group comprising low-pressure CVD, APCVD (atmospheric-pressure CVD), sputtering, evaporation and the sol-gel process.

Preferably, the intermediate layer 5 consists of a ZnO layer deposited by the LPCVD (low-pressure CVD) process so as to obtain the required surface morphology of the top face, by growth of ZnO (cf. J. Steinhauser, L. Feitknecht, S. Faÿ, R. Schlüchter, A. Shah, C. Ballif, J. Springer, L. Mullerova-Hodakova, A. Purkrt, A. Poruba and M. Vanecek, Proc. of the 20th European PVSEC (2005) 1608). The advantage of such process is a one step process, which allows the growth of the intermediate layer which has naturally the morphology required by the present invention. US 2002/0011263 disclosed a two-steps process, comprising a step of depositing and a step of etching the intermediate layer to modify and obtain the required Ry. In the present invention, the modification of Ry is not required, but only the angular morphology of the elementary surfaces as defined above.

According to a variant of the invention, the surface morphology of the top face 10 of the intermediate layer 5, as defined above, may be obtained by a surface treatment after its deposition, using a process comprising, after the step of depositing the intermediate layer 5, an additional step of texturizing the top face 10 of the intermediate layer 5 so as to obtain the required surface morphology of the top face 10. This additional texturizing step uses one of the techniques chosen from the group comprising etching, chemical attack, plasma treatment, and sandblasting, these being known to those skilled in the art.

The "micromorph" cell according to the invention has an intermediate layer with faces having surface morphologies making it possible to optimally reconcile the morphologies theoretically required by each of the faces of the intermediate layer and thus to obtain a higher-performance device. In particular, the top elementary cell 6 benefits from the optimum morphology of the top face 10 of the intermediate layer 5, thereby making it possible to scatter and trap the light in the top elementary cell 6 and to reduce its thickness. This makes it possible to choose (free of any constraint) the substrate with the optimum morphology for the bottom cell 5. Thus, only the efficiency of the micromorph cell may be maximized.

The present description is based on a device comprising two elementary cells. Of course, the device according to the invention may comprise more than two elementary cells, at least two cells of which are separated by an intermediate layer according to the invention.

The following examples illustrate the present invention without however limiting its scope.

Examples

Three tandem cells of the "micromorph" type with a n-i-p/n-i-p configuration are compared:

with no intermediate layer (Example 1);
with a standard intermediate layer (Example 2); and
with an intermediate layer according to the invention (Example 3).

The elementary cells are composed of a top cell 6 made of amorphous silicon and a bottom cell 4 made of microcrystalline silicon. These layers are preferably deposited by PECVD (plasma-enhanced chemical vapour deposition) process.

The substrate 2 used is glass (Schott AF 45) and the texture is given by the rough first conducting layer 3 (back contact) which is composed of silver (Ag) deposited by high-temperature sputtering (cf. R. H. Franken, R. L. Stolk, H. Li, C. H. M. v. d. Werf, J. K. Rath and R. E. I. Schropp, Journal of Applied Physics 102 (2007) 014503) and of a fine (70 nm) zinc oxide (ZnO) layer also deposited by sputtering and providing a diffusion barrier between the metal contact and the photovoltaic layers. The top cell 6 has a thickness of 200 nm. The bottom cell 4 has a thickness of 3 μm.

The layer 7 is a ZnO layer deposited by LP-CVD.

The standard-type intermediate layer consists of a layer of $SiO_x$ 100 nm in thickness deposited by PECVD.

The intermediate layer having the morphology according to the invention consists of a ZnO layer 1.5 μm in thickness deposited by LP-CVD (cf. J. Steinhauser, L. Feitknecht, S. Faÿ, R. Schlüchter, A. Shah, C. Ballif, J. Springer, L. Mullerova-Hodakova, A. Purkrt, A. Poruba and M. Vanecek, Proc. of the 20th European PVSEC (2005) 1608). This process makes it possible to grow a layer having the optimum surface morphology for depositing the top cell in a one step process.

Figure 3:
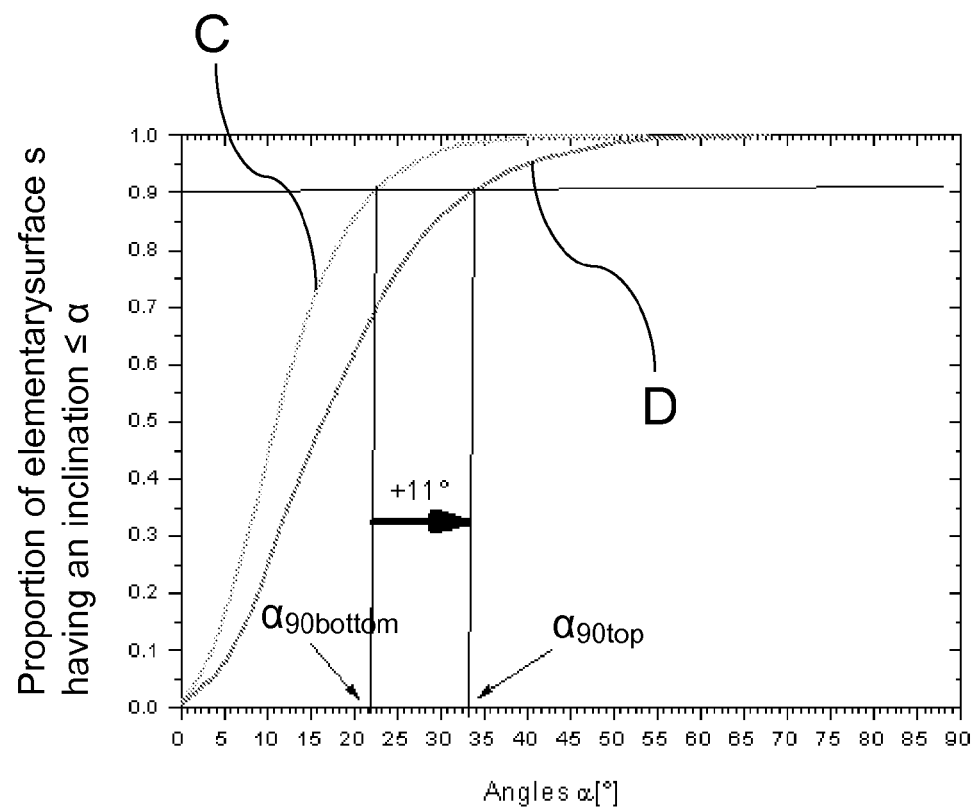
FIG. 3 shows the integral of the angular distribution of the top and bottom faces of the intermediate layer in a device according to the invention.

The surface morphologies of the top and bottom faces of the intermediate layer according to the invention are measured using the method described above. The integral of the angular distribution of the two faces of the intermediate layer in question, shown in FIG. 3, is obtained. In this figure, the angles are plotted on the x-axis. The proportion of the elementary surfaces having an inclination equal to or less than a given angle is plotted on the y-axis. Curve C corresponds to the bottom face of the intermediate layer and curve D corresponds to the top face. For each surface, an angle $\alpha_{90}$ is defined, which indicates that 90% of the elementary surfaces of the surface have an inclination equal to or less than this angle. In the present example, $\alpha_{90bottom}$ is equal to 22° and $\alpha_{90top}$ is equal to 33°, i.e. a difference ($\alpha_{90top}-\alpha_{90bottom}$) of 11°.

The surface of the interface between the layers measured by AFM can also be characterized with the standard technology like Root Mean Square Roughness (RMS) and peak to valley roughness (Ry=Rmax). The roughnesses are indicated in the following table for the example 3:

|  | RMS [nm] | Ry [nm] |
|---|---|---|
| Interface 3-4 (substrate) | 70 | 429 |
| Interface 11 (bottom) | 60 | 350 |
| Interface 10 (top) | 72 | 460 |

The surface roughness Ry of the bottom face 11 of the interface in the example 3 is 350 nm, which is greater than the value of 150 nm, known from one skilled in the art and from US 2002/0011263 to not deteriorate the electrical properties of the cell.

The surface roughness Ry of the bottom face 11 is lower than the surface roughness Ry of the top face 10 in the example 3, contrary to the teaching of U.S. Pat. No. 6,825,408.

By way of comparison, the top and bottom faces of the standard intermediate layer (Example 2) have the same morphology, in such a way that the difference ($\alpha_{90top}-\alpha_{90bottom}$) is of 0°.

The following parameters are measured under the standard conditions with an AM 1.5 G solar spectrum: the open-circuit voltage ($V_{oc}$), the fill factor (FF), the short-circuit current density ($J_{sc}$) and the conversion efficiency ($\eta$).

The results obtained are indicated in the following table:

| Device | Intermediate layer | $J_{sc}$ (mA/cm²) | $V_{oc}$ (V) | FF | $\eta$ (%) |
|---|---|---|---|---|---|
| Example 1 (comparative) | — | 9.5 | 1.27 | 0.737 | 8.9 |
| Example 2 (comparative) | 100 nm SiO$_x$ | 10.2 | 1.27 | 0.700 | 9.1 |
| Example 3 (Invention) | ZnO-LPCVD 1500 nm | 11.3 | 1.28 | 0.680 | 9.8 |

Figure 4:
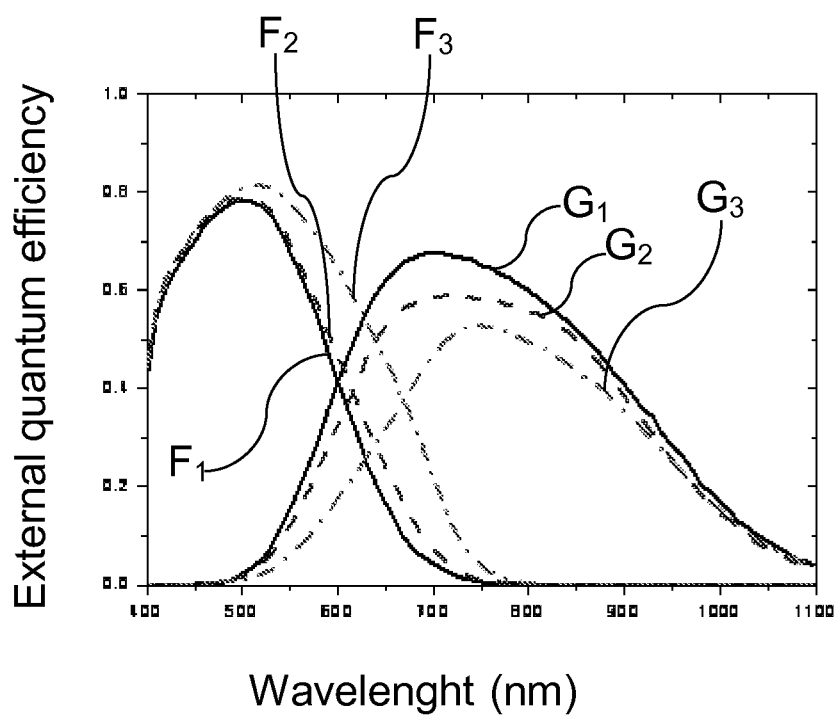
FIG. 4 shows the external quantum efficiency of the bottom and top cells without a mirror, with a standard mirror and with an intermediate mirror according to the present invention.

The external quantum efficiencies of the two cells are shown in FIG. 4 in which:
- curves F1, F2 and F3 show the external quantum efficiency of the top cell for each of Examples 1, 2 and 3 respectively; and
- curves G1, G2 and G3 show the external quantum efficiency of the bottom cell for each of Examples 1, 2 and 3 respectively.

The results show that the benefit obtained using an intermediate layer having the surface morphology of the invention consists of an increase in the current in the top elementary cell from 10.2 mA/cm² to 12.2 mA/cm² (11.3 being the current in the bottom elementary cell), i.e. an improvement of 19.6%, thanks to the roughness adapted to the light scattering in the top elementary cell, while maintaining the electrical characteristics. The efficiency of the "micromorph" cell increases from 9.1% for a cell with a standard intermediate layer to 9.8% for a cell with an intermediate layer having the surface morphology according to the invention, i.e. an improvement of 7.7%.

The invention claimed is:

1. A multiple-junction photoelectric device comprising a substrate on which a first conducting layer is deposited, at least two elementary photoelectric devices of n-i-p or n-p configuration, on which a second conducting is deposited, and at least one intermediate layer provided between two adjacent elementary photoelectric devices, wherein said intermediate layer has, on the incoming light side, an top face and, on the other side, a bottom face, said bottom face having a peak to valley roughness greater than 150 nm, and wherein said top and bottom faces have respectively a surface morphology comprising inclined elementary surfaces such that $\alpha_{90bottom}$ is smaller than $\alpha_{90top}$ by at least 3°, where $\alpha_{90top}$ is the angle for which 90% of the elementary surfaces of the top face of the intermediate layer have an inclination equal to or less than this angle, and $\alpha_{90bottom}$ is the angle for which 90% of the elementary surfaces of the bottom face of the intermediate layer have an inclination equal to or less than this angle.

2. The device according to claim 1, wherein $\alpha_{90bottom}$ is smaller than $\alpha_{90top}$ by at least 6°.

3. The device according to claim 2, wherein $\alpha_{90bottom}$ is smaller than $\alpha_{90top}$ by at least 10°.

4. The device according to claim 3, wherein $\alpha_{90bottom}$ is smaller than $\alpha_{90top}$ by at least 15°.

5. The device according to claim 1, wherein $\alpha_{90top}$ is comprised between 20° and 80°.

6. The device according to claim 5, wherein $\alpha_{90top}$ is comprised between 25° and 50°.

7. The device according to claim 1, wherein $\alpha_{90bottom}$ is comprised between 5° and 40°.

8. The device according to claim 7, wherein $\alpha_{90bottom}$ is comprised between 5° and 25°.

9. The device according to claim 1, wherein the elementary photoelectric device, on the side towards the substrate is based on microcrystalline silicon and wherein the elementary photoelectric device, on the incoming light side, is based on amorphous silicon.

10. The device according to claim 1, wherein the intermediate layer has a thickness of between 0.6 µm and 5 µm.

11. The device according to claim 10, wherein the intermediate layer has a thickness of between 0.8 µm and 3 µm.

12. The device according to claim 1, wherein the intermediate layer consists of a layer with a refractive index different from that of silicon (n=4).

13. The device according to claim 12, wherein the intermediate layer consists of a layer with a refractive index n being between 1.5 and 2.5.

14. The device according to claim 1, wherein the intermediate layer consists of a layer of an oxide chosen from the group consisting of zinc oxide, doped silicon oxides, doped porous silicon oxides, tin oxide, indium oxide and combinations thereof.

15. The device according to claim 14, wherein the surface morphology of the top face of the intermediate layer is obtained during growth of the chosen oxide.

16. The device according to claim 15, wherein the intermediate layer consists of a ZnO layer deposited by LPCVD (low-pressure CVD) so as to obtain the required surface morphology of the top face by growth of the ZnO.

17. The device according to claim 1, wherein the surface morphology of the top face of the intermediate layer is obtained by a surface treatment after said intermediate layer has been deposited.

18. A process for producing a multiple-junction photoelectric device comprising a substrate on which a first conducting layer is deposited, at least two elementary photoelectric devices of n-i-p or n-p configuration on which a second conducting layer is deposited, wherein it includes a step of depositing, on at least one of said elementary photoelectric devices, an intermediate layer having, on the incoming light side, an top face and, on the other side, a bottom face, said bottom face having a peak to valley roughness greater than 150 nm, and said top and bottom faces having respectively a surface morphology comprising inclined elementary surfaces such that $\alpha_{90bottom}$ is smaller than $\alpha_{90top}$ by at least 3°, where $\alpha_{90top}$ is the angle for which 90% of the surface of the top face of the intermediate layer contains elementary surfaces having an inclination equal to or less than this angle, and $\alpha_{90bottom}$ is the angle for which 90% of the surface of the bottom face of the intermediate layer contains elementary surfaces having an inclination equal to or less than this angle.

19. The process according to claim 18, wherein $\alpha_{90bottom}$ is smaller than $\alpha_{90top}$ by at least 6°.

20. The process according to claim 19, wherein $\alpha_{90bottom}$ is smaller than $\alpha_{90top}$ by at least 10°.

21. The process according to claim 20, wherein $\alpha_{90bottom}$ is smaller than $\alpha_{90top}$ by at least 15°.

22. The process according to claim 18, wherein the intermediate layer consists of a layer of an oxide chosen from the group consisting of zinc oxide, doped silicon oxides, doped porous silicon oxides, tin oxide, indium oxide and combinations thereof.

23. The process according to claim 22, wherein the step of depositing the intermediate layer uses a one step process for obtaining the required surface morphology of the top face by growth of the oxide used.

24. The process according to claim 23, wherein said process carried out during the step of depositing the intermediate layer uses one of the techniques chosen from the group consisting of LPCVD (low-pressure CVD), high-pressure CVD, sputtering, evaporation and the sol-gel process.

25. The process according to claim 22, wherein the intermediate layer consists of a ZnO layer and wherein the step of depositing said intermediate layer uses the LPCVD (low-pressure CVD) process enabling the required surface morphology of the top face to be obtained by growth of the ZnO.

26. The process according to claim 18, wherein it includes, after the step of depositing the intermediate layer, an additional step of texturizing the top face of the intermediate layer so as to obtain the required surface morphology of the top face.

27. The process according to claim 26, wherein said additional texturizing step uses one of the techniques chosen from the group consisting of etching, chemical attack, plasma treatment, and sandblasting.

\* \* \* \* \*

UNITED STATES PATENT AND TRADEMARK OFFICE
CERTIFICATE OF CORRECTION

PATENT NO.        : 8,704,084 B2  
APPLICATION NO. : 13/130228  
DATED             : April 22, 2014  
INVENTOR(S)       : Soderstrom et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 362 days.

Signed and Sealed this

Twenty-ninth Day of September, 2015

Michelle K. Lee
*Director of the United States Patent and Trademark Office*